United States Patent
Yang et al.

(10) Patent No.: US 10,545,592 B2
(45) Date of Patent: Jan. 28, 2020

(54) TOUCH DISPLAY MODULE, METHOD FOR DRIVING THE SAME, TOUCH DISPLAY PANEL AND TOUCH DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Shengji Yang, Beijing (CN); Xue Dong, Beijing (CN); Hailin Xue, Beijing (CN); Xiaochuan Chen, Beijing (CN); Haisheng Wang, Beijing (CN); Weijie Zhao, Beijing (CN); Yingming Liu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/554,173

(22) PCT Filed: Jan. 5, 2017

(86) PCT No.: PCT/CN2017/070226
§ 371 (c)(1),
(2) Date: Aug. 28, 2017

(87) PCT Pub. No.: WO2017/177730
PCT Pub. Date: Oct. 19, 2017

(65) Prior Publication Data
US 2019/0025965 A1    Jan. 24, 2019

(30) Foreign Application Priority Data

Apr. 11, 2016 (CN) .......................... 2016 1 0221874

(51) Int. Cl.
*G06F 3/041* (2006.01)
*H01L 27/32* (2006.01)
(Continued)

(52) U.S. Cl.
CPC .......... *G06F 3/0412* (2013.01); *G06F 3/0418* (2013.01); *G09G 3/3266* (2013.01);
(Continued)

(58) Field of Classification Search
CPC .. G09G 3/3233; G09G 3/3648; G09G 3/3696; G09G 3/3208; G06F 3/044; G06F 3/0412
See application file for complete search history.

(56) References Cited

U.S. PATENT DOCUMENTS

2010/0156954 A1* 6/2010 Kim .................. G09G 3/3648
345/690
2012/0161140 A1 6/2012 Xue et al.
(Continued)

FOREIGN PATENT DOCUMENTS

| CN | 101989399 A | 3/2011 |
| CN | 102314248 A | 1/2012 |

(Continued)

OTHER PUBLICATIONS

First Office Action for Chinese Application No. 201610221874.9, dated Oct. 11, 2017, 8 Pages.
(Continued)

*Primary Examiner* — Sepehr Azari
(74) *Attorney, Agent, or Firm* — Brooks Kushman P.C.

(57) ABSTRACT

The touch display module includes touch electrodes, a plurality of pixel units arranged in rows and columns, a plurality of gate lines, and a plurality of data lines crossing the plurality of gate lines. The touch display module further includes a plurality of touch scanning lines. The pixel units in two columns are arranged between every two adjacent
(Continued)

data lines, and each data line is electrically connected to the pixel units arranged in two columns and adjacent to the data line. Each touch scanning line is arranged between two adjacent data lines and connected to the corresponding touch electrode. Two gate lines are arranged between every two adjacent rows of pixel units. The pixel units in each row include a first pixel unit and a second pixel unit arranged adjacent to each other.

16 Claims, 8 Drawing Sheets

(51) Int. Cl.
*G09G 3/3291* (2016.01)
*G09G 3/3266* (2016.01)

(52) U.S. Cl.
CPC ......... *G09G 3/3291* (2013.01); *H01L 27/323* (2013.01); *G09G 2300/043* (2013.01); *G09G 2300/0426* (2013.01); *G09G 2300/0439* (2013.01)

(56) References Cited

U.S. PATENT DOCUMENTS

| | | | | |
|---|---|---|---|---|
| 2014/0111473 | A1* | 4/2014 | Yang | G06F 3/044 345/174 |
| 2015/0205156 | A1 | 7/2015 | Xu | |
| 2016/0019827 | A1* | 1/2016 | Lee | G09G 3/3208 345/204 |
| 2016/0224157 | A1 | 8/2016 | Yang | |
| 2016/0247447 | A1* | 8/2016 | Yang | G09G 3/3233 |
| 2017/0031487 | A1 | 2/2017 | Wang et al. | |
| 2017/0168646 | A1 | 6/2017 | Yang et al. | |

FOREIGN PATENT DOCUMENTS

| | | |
|---|---|---|
| CN | 102566166 A | 7/2012 |
| CN | 102841718 A | 12/2012 |
| CN | 103412676 A | 11/2013 |
| CN | 103760703 A | 4/2014 |
| CN | 104091559 A | 10/2014 |
| CN | 104091820 A | 10/2014 |
| CN | 104850270 A | 8/2015 |
| CN | 104951143 A | 9/2015 |
| CN | 204945586 U | 1/2016 |
| CN | 105679251 A | 6/2016 |
| CN | 205507290 U | 8/2016 |
| JP | 2010091608 A | 4/2010 |

OTHER PUBLICATIONS

International Search Report and Written Opinion for Application No. PCT/CN2017/070226, dated Mar. 29, 2017, 11 Pages.

* cited by examiner

TOUCH DISPLAY MODULE, METHOD FOR DRIVING THE SAME, TOUCH DISPLAY PANEL AND TOUCH DISPLAY DEVICE

CROSS-REFERENCE TO RELATED APPLICATIONS

This application is the U.S. national phase of PCT Application No. PCT/CN2017/070226 filed on Jan. 5, 2017, which claims priority to Chinese Patent Application No. 201610221874.9 filed on Apr. 11, 2016, which are incorporated herein by reference in their entireties.

TECHNICAL FIELD

The present disclosure relates to the field of touch display technology, in particular a touch display module, a method for driving the same, a touch display panel and a touch display device.

BACKGROUND

A conventional in-cell self-capacitive Active-Matrix Organic Light-Emitting Diode (AMOLED) touch display module is driven in a time-division manner, i.e., pixel display driving and compensating operations are performed at a display time period, and a touch driving operation is performed at a touch time period.

A single-pixel compensation circuit is adopted by the conventional touch display module. A data line needs to be provided with respect to pixel units in each column so as to apply a data signal at the display time period, and an additional via-hole and an additional touch scanning line need to be arranged at a pixel region so as to apply a touch scanning signal to a touch electrode at the touch time period. Due to this design, an aperture ratio of the pixel region may be reduced, and thereby a service life of a display panel may be adversely affected.

SUMMARY

A main object of the present disclosure is to provide a touch display module, a driving method thereof, a touch display panel and a touch display device, so as to solve the problem in the related art where the aperture ratio of the pixel region is reduced due to the additional touch scanning line at the pixel region.

In one aspect, the present disclosure provides in some embodiments a touch display module including touch electrodes, a plurality of pixel units arranged in rows and columns, a plurality of gate lines, and a plurality of data lines crossing the plurality of gate lines. The touch display module further includes a plurality of touch scanning lines. The pixel units in two columns are arranged between every two adjacent data lines, and each data line is electrically connected to the pixel units arranged in two columns and adjacent to the data line. Each touch scanning line is arranged between two adjacent data lines and connected to the corresponding touch electrode. Two gate lines are arranged between every two adjacent rows of pixel units. The pixel units in each row include a first pixel unit and a second pixel unit arranged adjacent to each other. The two gate lines include a first gate line and a second gate line. The first pixel unit and the second pixel unit are electrically connected to a same data line, the first pixel unit is connected to the first gate line, and the second pixel unit is connected to the second gate line.

In a possible embodiment of the present disclosure, the touch scanning line is arranged between two adjacent columns of pixel units which are connected to different data lines.

In a possible embodiment of the present disclosure, the touch scanning line extends in a same direction to the data line.

In a possible embodiment of the present disclosure, the touch display module further includes a touch driving unit connected to the touch scanning line and configured to output a touch scanning signal to the corresponding touch electrode via the touch scanning line at a touch time period.

In a possible embodiment of the present disclosure, the touch display module further includes a plurality of cathodic electrodes multiplexed as the touch electrodes, and the touch driving unit is further configured to output the touch scanning signal to the corresponding cathodic electrode via the touch scanning line at the touch time period.

In a possible embodiment of the present disclosure, each pixel unit includes an organic light-emitting diode (OLED) and a pixel driver circuit connected to each other. The pixel driver circuit is further connected to a light-emission control line. The touch driving unit is further connected to the light-emission control line and further configured to output a light-emission turn-off control signal to the light-emission control line at the touch time period, so as to enable an anode of the corresponding OLED to be in a floating state under the control of the pixel driver circuit.

In a possible embodiment of the present disclosure, the touch display module includes a plurality of first pixel units, a plurality of second pixel units, a plurality of first gate lines and a plurality of second gate lines. Each first pixel unit includes a first OLED and a first pixel driver circuit, and each second pixel unit includes a second OLED and a second pixel driver circuit. Each first pixel unit and the corresponding second pixel unit are arranged in a same row and in adjacent columns, and an $n^{th}$ data line is arranged between the first pixel unit and the second pixel unit, where n is a positive integer. Each first pixel driver circuit is connected to one of the first gate lines, and each second pixel driver circuit is connected to one of the second gate lines. Each first pixel driver circuit and the corresponding second pixel driver circuit are connected to the $n^{th}$ data line, so as to receive a data signal from the $n^{th}$ data line in a time-division manner at a display time period.

In a possible embodiment of the present disclosure, each first pixel driver circuit and the corresponding second pixel driver circuit are connected to a same light-emission control line. Each first pixel driver circuit includes a first driving transistor, a first storage capacitor, a first resetting module, a first charging control module and a first light-emission control module. Each second pixel driver circuit includes a second driving transistor, a second storage capacitor, a second resetting module, a second charging control module and a second light-emission control module. A gate electrode of the first driving transistor is connected to the first resetting module, a first electrode thereof is connected to a first level line through the first light-emission control module and further connected to the gate electrode of the first driving transistor through the first charging control module, and a second electrode thereof is connected to an anode of the first OLED through the first light-emission control module and further connected to the $n^{th}$ data line through the first charging control module. A first end of the first storage capacitor is connected to the gate electrode of the first driving transistor, and a second end thereof is connected to the first level line. A gate electrode of the second driving transistor is connected to the second resetting module, a first electrode thereof is connected to the first level line through the second light-emission control module and further connected to the gate electrode of the second driving transistor through the second charging control module, and a second electrode thereof is connected to an anode of the second OLED through the second light-emission control module and further connected to the $n^{th}$ data line through the second charging control module. A first end of the second storage capacitor is connected to the gate electrode of the second driving transistor, and a second end of the second storage capacitor is connected the first level line.

In a possible embodiment of the present disclosure, the first resetting module is connected to a resetting scanning line and a resetting signal line, and configured to, at a resetting stage of each display time period, reset a potential at the gate electrode of the first driving transistor to a resetting voltage on the resetting signal line under the control of a first scanning signal from the resetting scanning line, so as to turn off the first driving transistor. The second resetting module is connected to the resetting scanning line and the resetting signal line, and configured to, at the resetting stage of each display time period, reset a potential at the gate electrode of the second driving transistor to the resetting voltage on the resetting signal line under the control of the first scanning signal from the resetting scanning line, so as to turn off the second driving transistor. The first charging control module is connected to the first gate line and the $n^{th}$ data line, and configured to, at a first charging stage of each display time period, enable the first electrode of the first driving transistor to be connected to the gate electrode of the first driving transistor and enable the second electrode of the first driving transistor to receive a first data voltage Vdata1 on the $n^{th}$ data line under the control of a second scanning signal from the first gate line, so as to turn on the first driving transistor, thereby to enable the first data voltage Vdata1 to charge the first storage capacitor through the first driving transistor until the potential at the gate electrode of the first driving transistor is equal to Vdata1− Vth1, where Vth1 represents a threshold voltage of the first driving transistor. The second charging control module is connected to the second gate line and the $n^{th}$ data line, and configured to, at a second charging stage of each display time period, enable the first electrode of the second driving transistor to be connected to the gate electrode of the second driving transistor and enable the second electrode of the second driving transistor to receive a second data voltage Vdata2 on the $n^{th}$ data line under the control of a third scanning signal from the second gate line, so as to turn on the second driving transistor, thereby to enable the second data voltage Vdata2 to charge the second storage capacitor through the second driving transistor until the potential at the gate electrode of the second driving transistor is equal to Vdata2−Vth2, where Vth2 represents a threshold voltage of the second driving transistor. The first light-emission control module is connected to the light-emission control line and the first level line, and configured to, at a light-emitting stage of each display time period, enable the first electrode of the first driving transistor to be electrically connected to the first level line and enable the second electrode of the first driving transistor to be electrically connected to the anode of the first OLED under the control of the light-emission control line, so as to enable the first driving transistor to drive the first OLED to emit light. The second light-emission control module is connected to the light-emission control line and the first level line, and configured to, at the light-emitting stage of each display time period, enable the first electrode of the second driving transistor to be electrically connected to the first level line and enable the second electrode of the second driving transistor to be electrically connected to the anode of the second OLED under the control of the light-emission control line, so as to enable the second driving transistor to drive the second OLED to emit light.

In a possible embodiment of the present disclosure, the touch driving unit is further configured to, at the touch time period, output a light-emission turn-off control signal to the light-emission control line, so as to enable the anode of the first OLED to be in the floating state under the control of the first pixel driver circuit and thereby to enable the first OLED not to emit light, and enable the anode of the second OLED to be in the floating state under the control of the second pixel driver circuit and thereby to enable the second OLED not to emit light.

In a possible embodiment of the present disclosure, the touch driving unit is further configured to, at the touch time period, output the touch scanning signal to the touch electrode, the data line, the resetting scanning line, the first gate line and the second gate line simultaneously, so as to drive the touch electrode, the data line, the resetting scanning line, the first gate line and the second gate line synchronously.

In another aspect, the present disclosure provides in some embodiments a method for driving the above-mentioned touch display module, including steps of: at a display time period, enabling pixel units arranged in two columns and electrically connected to a same data line to receive a data signal from the data line in a time-division manner; and at a touch time period, outputting a touch scanning signal to a touch electrode through a touch scanning line arranged between two adjacent data lines.

In a possible embodiment of the present disclosure, the touch display module further includes a touch driving unit, and the step of outputting the touch scanning signal to the touch electrode through the touch scanning line arranged between the two adjacent data lines includes outputting, by the touch driving unit, the touch scanning signal to the touch electrode through the touch scanning line.

In a possible embodiment of the present disclosure, the touch display module further includes a plurality of cathodic electrodes. The method further includes enabling the plurality of cathodic electrodes of the touch display module to be multiplexed as the touch electrodes. The step of outputting, by the touch driving unit, the touch scanning signal to the touch electrode through the touch scanning line includes outputting, by the touch driving unit, the touch scanning signal to the cathodic electrode through the touch scanning line.

In a possible embodiment of the present disclosure, the pixel units in each column include a plurality of subpixel units each includes an OLED and a pixel driver circuit. The method further includes, at the touch time period, enabling, by the pixel driver circuit, an anode of the corresponding OLED to be in a floating state, so as to enable the OLED not to emit light.

In a possible embodiment of the present disclosure, the step of enabling, by the pixel driver circuit, the anode of the corresponding OLED to be in the floating state includes outputting, by the touch driving unit, a light-emission turn-off control signal to the light-emission control line, so as to enable the anode of the corresponding OLED to be in the floating state under the control of the pixel driver circuit.

In a possible embodiment of the present disclosure, the touch display module includes a plurality of first pixel units, a plurality of second pixel units, a plurality of first gate lines and a plurality of second gate lines. Each first pixel unit includes a first OLED and a first pixel driver circuit, and each second pixel unit includes a second OLED and a second pixel driver circuit. Each first pixel unit and the corresponding second pixel unit are arranged in a same row and in adjacent columns, and an $n^{th}$ data line is arranged between the first pixel unit and the second pixel unit, where n is a positive integer. Each first pixel driver circuit is connected to one of the first gate lines, and each second pixel driver circuit is connected to one of the second gate lines. Each first pixel driver circuit and the corresponding second pixel driver circuit are connected to the $n^{th}$ data line. The step of enabling, at the display time period, the pixel units arranged in two columns and electrically connected to the same data line to receive the data signal from the data line in a time-division manner includes enabling, at the display time period, the first pixel driver circuit and the second pixel driver circuit to receive a data signal from the $n^{th}$ data line in a time-division manner.

In a possible embodiment of the present disclosure, each first pixel driver circuit and the corresponding second pixel driver circuit are connected to a same light-emission control line. Each first pixel driver circuit includes a first driving transistor, a first storage capacitor, a first resetting module, a first charging control module and a first light-emission control module. Each second pixel driver circuit includes a second driving transistor, a second storage capacitor, a second resetting module, a second charging control module and a second light-emission control module. The display time period includes a resetting stage, a first charging stage, a second charging stage and a light-emitting stage. The step of enabling, at the display time period, the first pixel driver circuit and the second pixel driver circuit to receive the data signal from the $n^{th}$ data line in a time-division manner includes: at the resetting stage of each display time period, resetting, by the first resetting module, a potential at a gate electrode of the first driving transistor to a resetting voltage on the resetting signal line under the control of a first scanning signal from the resetting scanning line so as to turn off the first driving transistor, and resetting, by the second resetting module, a potential at a gate electrode of the second driving transistor to the resetting voltage on the resetting signal line under the control of the first scanning signal from the resetting scanning line so as to turn off the second driving transistor; at the first charging stage of each display time period, enabling, by the first charging control module, a first electrode of the first driving transistor to be electrically connected to the gate electrode of the first driving transistor and enabling a second electrode of the first driving transistor to receive a first data voltage Vdata1 on the $n^{th}$ data line under the control of a second scanning signal from the first gate line, so as to turn on the first driving transistor, thereby to enable the first data voltage Vdata1 to charge the first storage capacitor through the first driving transistor until the potential at the gate electrode of the first driving transistor is equal to Vdata1−Vth1, where Vth1 represents a threshold voltage of the first driving transistor; at the second charging stage of each display time period, enabling, by the second charging control module, a first electrode of the second driving transistor to be electrically connected to the gate electrode of the second driving transistor and enabling a second electrode of the second driving transistor to receive a second data voltage Vdata2 on the $n^{th}$ data line under the control of a third scanning signal from the second gate line, so as to turn on the second driving transistor, thereby to enable the second data voltage Vdata2 to charge the second storage capacitor through the second driving transistor until the potential at the gate electrode of the second driving transistor is equal to Vdata2−Vth2, where Vth2 represents a threshold voltage of the second driving transistor; and at the light-emitting stage of each display time period, enabling, by the first light-emission control module, the first electrode of the first driving transistor to be electrically connected to a first level line and enabling the second electrode of the first driving transistor to be electrically connected to the anode of the first OLED under the control of the light-emission control line, so as to enable the first driving transistor to drive the first OLED to emit light, and enabling, by the second light-emission control module, the first electrode of the second driving transistor to be electrically connected to the first level line and enabling the second electrode of the second driving transistor to be electrically connected to the anode of the second OLED under the control of the light-emission control line, so as to enable the second driving transistor to drive the second OLED to emit light.

In a possible embodiment of the present disclosure, the method further includes, at the touch time period, outputting, by the touch driving unit, the touch scanning signal to the touch electrode, the data line, the resetting scanning line, the first gate line and the second gate line, so as to drive the touch electrode, the data line, the resetting scanning line, the first gate line and the second gate line synchronously.

In yet another aspect, the present disclosure provides in some embodiments a touch display panel including the above-mentioned touch display module.

In still yet another aspect, the present disclosure provides in some embodiments a touch display device including the above-mentioned touch display panel.

According to the touch display module, the driving method thereof, the touch display panel and the touch display device in the embodiments of the present disclosure, the pixel units in two columns are arranged between every two adjacent data lines, and each data line is electrically connected to the pixel units arranged in two columns and adjacent to the data line. In addition, the touch scanning signal is applied to the touch electrode through the touch scanning line arranged between the two adjacent data lines. As a result, it is unnecessary to provide the touch scanning line at a pixel region while reducing the number of the data lines, thereby to improve an aperture ratio of the pixel region and prolong a service life of the display panel.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
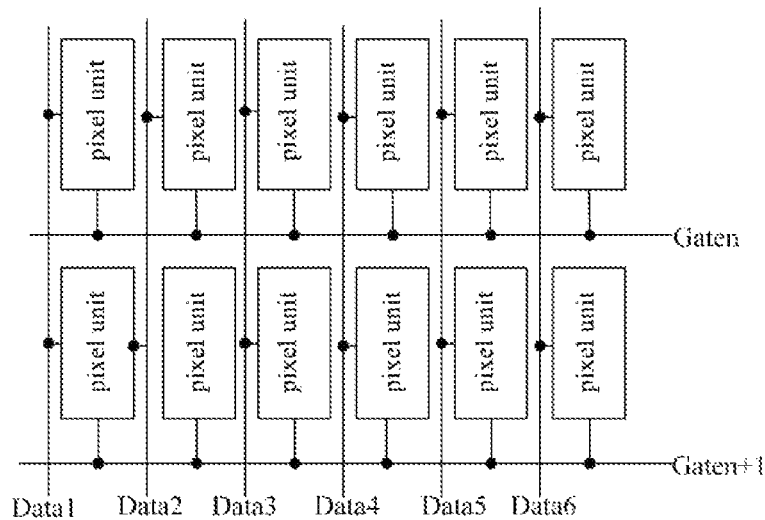
FIG. 1 is a schematic view showing a conventional touch display module.

As shown in FIG. 1, in a conventional touch display module, pixel units in an upper row presents the pixel units in an $n^{th}$ row, and pixel units in a lower row represents the pixel units in an $(n+1)^{th}$ row, where n is a positive integer. Data1, Data2, Data3, Data4, Data5 and Data6 represent a first data line, a second data line, a third data, a fourth data line, a fifth data line and a sixth data line. Gate n represents an $n^{th}$ gate line, and Gate n+1 represents an $(n+1)^{th}$ gate line. The pixel units in a first column are connected to Data1, the pixel units in a second column are connected to Data2, the pixel units in a third column are connected to Data3, the pixel units in a fourth column are connected to Data4, the pixel units in a fifth column are connected to Data5, the pixel units in a sixth column are connected to Data6, the pixel units in an $n^{th}$ row are connected to Gate n, and the pixel units in an $(n+1)^{th}$ row are connected to Gate n+1.

As shown in FIG. 1, a single-pixel compensation circuit is adopted by the conventional touch display module, and it is necessary to provide a data line for the pixel units in each column, so as to provide a data line at a display time period. In addition, an additional via-hole and an additional touch scanning line need to be provided at a pixel region, so as to apply a touch scanning signal to a touch electrode at a touch time period. Due to this design, an aperture ratio of the pixel region may be reduced, and thereby a service life of a display panel may be adversely affected.

Figure 9:
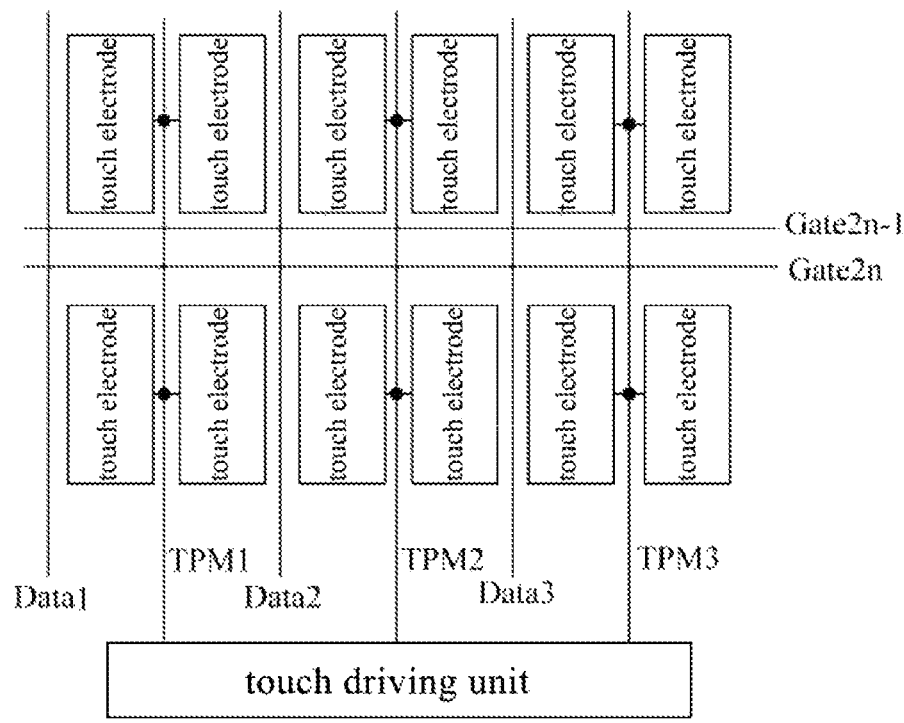
FIG. 9 is a schematic view showing touch electrodes in the touch display modules according to at least one embodiment of the present disclosure.

In order to overcome the above-mentioned defects, the present disclosure provides in some embodiments a touch display module, including touch electrodes, a plurality of pixel units arranged in rows and columns, a plurality of gate lines, and a plurality of data lines crossing the plurality of gate lines. The touch display module further includes a plurality of touch scanning lines. The pixel units in two columns are arranged between every two adjacent data lines, and each data line is electrically connected to the pixel units arranged in two columns and adjacent to the data line. As shown in FIG. 9, each touch scanning line is arranged between two adjacent data lines and connected to the corresponding touch electrode. Two gate lines are arranged between every two adjacent rows of pixel units. The pixel units in each row include a first pixel unit and a second pixel unit arranged adjacent to each other. The gate lines include a first gate line and a second gate line. The first pixel unit and the second pixel unit are electrically connected to a same data line, the first pixel unit is connected to the first gate line, and the second pixel unit is connected to the second gate line.

In the embodiments of the present disclosure, the first pixel unit and the second pixel unit are arranged in a same row and in two adjacent columns, and connected to different gate lines.

According to the touch display module in the embodiments of the present disclosure, the pixel units in two columns are arranged between every two adjacent data lines, and each data line is electrically connected to the pixel units arranged in two columns and adjacent to the data line. In addition, the touch scanning signal is applied to the touch electrode through the touch scanning line arranged between the two adjacent data lines. As a result, it is unnecessary to provide the touch scanning line at a pixel region while reducing the number of the data lines, thereby to improve an aperture ratio of the pixel region and prolong a service life of the display panel.

In a possible embodiment of the present disclosure, the touch scanning line is arranged between two adjacent columns of pixel units which are connected to different data lines. In other words, the touch scanning line is located between the pixel units arranged in two adjacent columns and connected to different data lines. A position of the touch scanning line will be described hereinafter in conjunction with the drawings.

In a possible embodiment of the present disclosure, the touch scanning line extends in a direction same to the data line. In other words, the pixel units in two columns may be arranged between every two adjacent data lines, and each data line is connected to the pixel units arranged in two columns and adjacent to the data line, so as to use a remaining signal line as the touch scanning line, thereby to simplify the arrangement process of the touch scanning line and improve the aperture ratio.

In a possible embodiment of the present disclosure, the touch display module further includes a touch driving unit connected to the touch scanning line and configured to output a touch scanning signal to the corresponding touch electrode via the touch scanning line at a touch time period.

In actual operation, each display period includes a display time period and a touch time period. In the embodiments of the present disclosure, the touch driving unit of the touch display module is configured to output at the touch time period, the touch scanning signal to the touch electrode through the touch scanning line arranged between two adjacent data lines.

Figure 2:
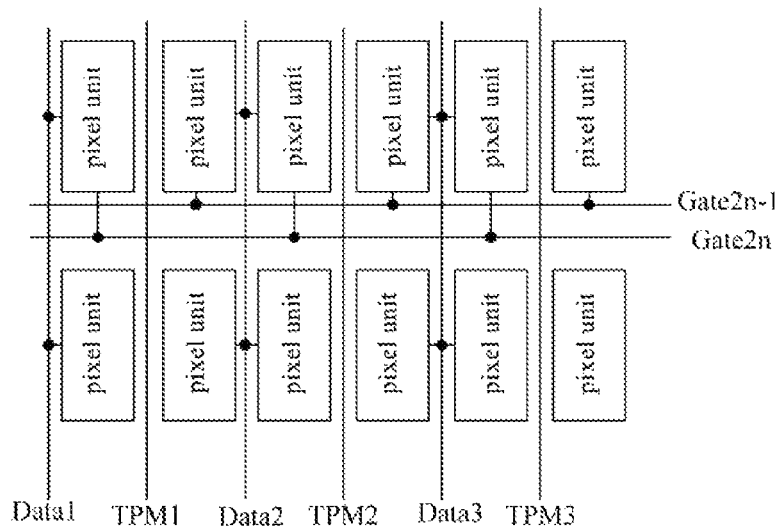
FIG. 2 is a schematic view showing a touch display module according to at least one embodiment of the present disclosure.

As shown in FIG. 2, the pixel units in an upper row represent the pixel units in an $n^{th}$ row, and the pixel units in a lower row represent the pixel units in an $(n+1)^{th}$ row, where n is a positive integer. Data1, Data2 and Data3 represent a first data line, a second data line and a third data line respectively. TPM1, TPM2 and TPM3 represent a first touch scanning line, a second touch scanning line and a third touch scanning line respectively. The pixel units in a first column are connected to Data1, the pixel units in a second column and a third column are connected to Data2, and the pixel units in a fourth column and a fifth column are connected to Data3. TPM1 is arranged between Data1 and Data2, TPM2 is arranged between Data2 and Data3, and TPM3 is arranged between Data3 and a fourth data line (not shown). At the display time period, the data signal is applied to the pixel units through Data1, Data2 and Data3 connected thereto, and at the touch time period, the touch scanning signal is applied to the touch electrodes through TPM1, TPM2 and TPM3 connected thereto.

In FIG. 2, Gate $2n-1$ represents a $(2n-1)^{th}$ gate line, and Gate $2n$ represents a $(2n)^{th}$ gate line. Gate $2n-1$ and Gate $2n$ are arranged between the $n^{th}$-row pixel units and the $(n+1)^{th}$-row pixel units. The pixel unit in the $n^{th}$ row and the first column is connected to Gate $2n$, the pixel unit in the $n^{th}$ row and the second column is connected to Gate $2n-1$, the pixel unit in the $n^{th}$ row and the third column is connected to Gate $2n$, the pixel unit in the $n^{th}$ row and the fourth column is connected to Gate $2n-1$, the pixel unit in the $n^{th}$ row and the fifth column is connected to Gate $2n$, and the pixel unit in the $n^{th}$ row and the sixth column is connected to Gate $2n-1$. Gate $2n$ and Gate $2n-1$ are configured to enable, at the display time period, the pixel unit in the $n^{th}$ row and the second column and the pixel unit in the $n^{th}$ row and the third column to receive the data signal from Data2 in a time-division manner, and enable, at the display time period, the pixel unit in the $n^{th}$ row and the fourth column and the pixel unit in the $n^{th}$ row and the fifth column to receive the data signal from Data3 in a time-division manner.

In the conventional touch display module, the data signal is not applied to the pixel units in two columns through one data line, so the number of the data lines is twice than that in FIG. 2, i.e., in the related art, the data line is located at a position where the touch scanning line is located in FIG. 2. Additional touch scanning lines need to be provided even in the case of more data lines, so an aperture ratio is too small. Through the double-pixel compensation circuit (i.e., through the application of the data signal to the pixel units in two columns via one data line), it is able to provide the touch scanning line between two data lines, thereby to improve the aperture ratio.

In a possible embodiment of the present disclosure, the touch display module further includes a plurality of cathodic electrodes which are also used as the touch electrodes, and the touch driving unit is further configured to output the touch scanning signal to the corresponding cathodic electrode via the touch scanning line at the touch time period.

During the design of an in-cell self-capacitive AMOLED touch display module, usually each cathodic electrode is arranged above a plurality of pixel units. The uppermost cathodic electrode may be divided and multiplexed, i.e., the cathodic electrode as an entire layer may be divided into a plurality of block-like cathodic electrodes with respect to each pixel region, and each block-like cathodic electrode may serve as a touch electrode at the touch time period. The touch scanning signal may be applied to the plurality of block-like cathodic electrodes through the touch scanning line at the touch time period.

In the related art, when the plurality of cathodic electrodes is divided and multiplexed as the touch electrodes, a via-hole and a TPM (touch electrode) line may be arranged at the pixel region. Due to this design, the aperture ratio of the pixel region may be reduced, and thereby a service life of the OLED may be adversely affected.

In a possible embodiment of the present disclosure, each pixel unit includes an OLED and a pixel driver circuit connected to each other.

In a possible embodiment of the present disclosure, the pixel driver circuit is configured to enable, at the touch time period, an anode of the corresponding OLED to be in a floating state, so as to enable the OLED not to emit light. At this time, a capacitance between a cathode and the anode may be omitted, so it is able to remarkably reduce RC loading, thereby to increase a touch driving frequency.

To be specific, the pixel driver circuit is further connected to a light-emission control line. The touch driving unit is further connected to the light-emission control line and further configured to output a light-emission turn-off control signal to the light-emission control line at the touch time period, so as to enable an anode of the corresponding OLED to be in a floating state under the control of the pixel driver circuit. Through this black frame insertion mode (i.e., a mode where no power is applied to the anode), the anode of the OLED may be equivalently in the floating state at the touch time period.

In a possible embodiment of the present disclosure, the touch driving unit is further configured to output, at the touch time period, the touch scanning signal to control lines connected to the pixel driver circuit other than the light-emission control line, and signal lines connected to the pixel driver circuit.

In a possible embodiment of the present disclosure, at the touch time period, the touch scanning signal is outputted not only to the touch electrode, but also to the control lines connected to the pixel driver circuit and arranged under the touch electrode (other than the light-emission control line) and the signal lines connected to the pixel driver circuit. In other words, at the touch time period, the touch electrode, the control lines connected to the pixel driver circuit (other than the light-emission control line) and the signal lines connected to the pixel driver circuit may be driven synchronously, so as to cancel out the influence of a ground capacitor on the touch electrode.

To be specific, the touch display module includes a plurality of first pixel units, a plurality of second pixel units, a plurality of first gate lines and a plurality of second gate lines.

Figure 3:
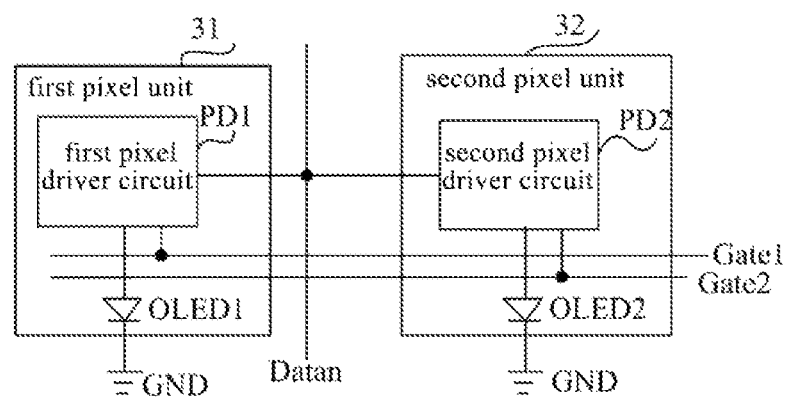
FIG. 3 is a schematic view showing a pixel unit included in the touch display module according to at least one embodiment of the present disclosure.

As shown in FIG. 3, each first pixel unit 31 includes a first OLED1 and a first pixel driver circuit PD1, and each second pixel unit 32 includes a second OLED2 and a second pixel driver circuit PD2. A cathode of the OLED1 and a cathode of the OLED2 are both connected to a ground end GND. The first pixel unit 31 and the corresponding second pixel unit 32 are arranged in a same row and in adjacent columns, and an $n^{th}$ data line Data n is arranged between the first pixel unit 31 and the second pixel unit 32, where n is a positive integer. Each first pixel driver circuit PD1 is connected to one of the first gate lines G1, and each second pixel driver circuit PD2 is connected to one of the second gate lines G2. Each first pixel driver circuit PD1 and the corresponding second pixel driver circuit PD2 are connected to the $n^{th}$ data line Data n, so as to receive a data signal from the $n^{th}$ data line Data n in a time-division manner at the display time period.

Figure 4:
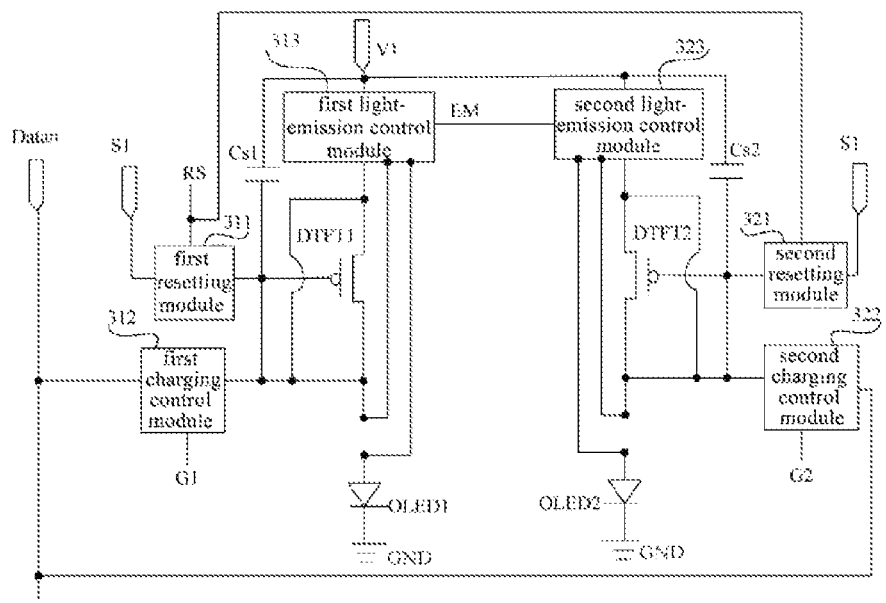
FIG. 4 is a schematic view showing a double-pixel compensation circuit of the touch display module according to at least one embodiment of the present disclosure.

To be specific, as shown in FIG. 4, each first pixel driver circuit and the corresponding second pixel driver circuit are connected to a same light-emission control line EM. Each first pixel driver circuit includes a first driving transistor DTFT1, a first storage capacitor Cs 1, a first resetting module 311, a first charging control module 312 and a first light-emission control module 313. Each second pixel driver circuit includes a second driving transistor DTFT2, a second storage capacitor Cs2, a second resetting module 321, a second charging control module 322 and a second light-emission control module 323. A gate electrode of the first driving transistor DTFT1 is connected to the first resetting module 311, a first electrode thereof is connected to a first level line through the first light-emission control module 313 and further connected to the gate electrode of the first driving transistor DTFT1 through the first charging control module 312, and a second electrode thereof is connected to an anode of the first OLED1 through the first light-emission control module 313 and further connected to the nth data line Data n through the first charging control module 312. A first end of the first storage capacitor Cs1 is connected to the gate electrode of the first driving transistor DTFT1, and a second end thereof is connected to the first level line. The first level line is configured to receive a first level V1. A gate electrode of the second driving transistor DTFT2 is connected to the second resetting module 321, a first electrode thereof is configured to receive the first level V1 through the second light-emission control module 323 and connected to the gate electrode of the second driving transistor DTFT2 through the second charging control module 322, and a second electrode thereof is connected to an anode of the second OLED2 through the second light-emission control module 323 and further connected to the nth data line Data n through the second charging control module 322. A first end of the second storage capacitor Cs2 is connected to the gate electrode of the second driving transistor DTFT2, and a second end of the second storage capacitor Cs2 is connected the first level line.

More specifically, as shown in FIG. 4, the first resetting module 311 is connected to a resetting scanning line RS and a resetting signal line S1, and configured to, at a resetting stage of each display time period, reset a potential at the gate electrode of the first driving transistor DTFT1 to a resetting voltage on the resetting signal line S1 under the control of a first scanning signal from the resetting scanning line RS, so as to turn off the first driving transistor DTFT1. The second resetting module 321 is connected to the resetting scanning line RS and the resetting signal line S1, and configured to, at the resetting stage of each display time period, reset a potential at the gate electrode of the second driving transistor DTFT2 to the resetting voltage on the resetting signal line S1 under the control of the first scanning signal from the resetting scanning line RS, so as to turn off the second driving transistor DTFT2. The first charging control module 312 is connected to the first gate line G1 and the $n^{th}$ data line Data n, and configured to, at a first charging stage of each display time period, enable the first electrode of the first driving transistor DTFT1 to be connected to the gate electrode of the first driving transistor DTFT1 and enable the second electrode of the first driving transistor DTFT1 to receive a first data voltage Vdata1 on the $n^{th}$ data line Data n under the control of a second scanning signal from the first gate line G1, so as to turn on the first driving transistor DTFT1, thereby to enable the first data voltage Vdata1 to charge the first storage capacitor Cs1 through the first driving transistor DTFT1 until the potential at the gate electrode of the first driving transistor DTFT1 is equal to Vdata1-Vth1, where Vth1 represents a threshold voltage of the first driving transistor DTFT1. The second charging control module 322 is connected to the second gate line G2 and the $n^{th}$ data line Data n, and configured to, at a second charging stage of each display time period, enable the first electrode of the second driving transistor DTFT2 to be connected to the gate electrode of the second driving transistor DTFT2 and enable the second electrode of the second driving transistor DTFT2 to receive a second data voltage Vdata2 on the $n^{th}$ data line Data n under the control of a third scanning signal from the second gate line G2, so as to turn on the second driving transistor DTFT2, thereby to enable the second data voltage Vdata2 to charge the second storage capacitor Cs2 through the second driving transistor DTFT2 until the potential at the gate electrode of the second driving transistor DTFT2 is equal to Vdata2-Vth2, where Vth2 represents a threshold voltage of the second driving transistor DTFT2. The first light-emission control module 313 is connected to the light-emission control line EM and the first level line, and configured to, at a light-emitting stage of each display time period, enable the first electrode of the first driving transistor DTFT1 to be connected to the first level line and enable the second electrode of the first driving transistor DTFT1 to be connected to the anode of the first OLED1 under the control of the light-emission control line EM, so as to enable the first driving transistor DTFT1 to drive the first OLED1 to emit light. The second light-emission control module 323 is connected to the light-emission control line EM and the first level line, and configured to, at the light-emitting stage of each display time period, enable the first electrode of the second driving transistor DTFT2 to be connected to the first level line and enable the second electrode of the second driving transistor DTFT2 to be connected to the anode of the second OLED2 under the control of the light-emission control line EM, so as to enable the second driving transistor DTFT2 to drive the second OLED2 to emit light. The first level line is configured to receive the first level V1.

In actual operation, as shown in FIG. 4, the resetting signal line S1 may be a common electrode line for outputting a common voltage Vcom, or a ground line.

In FIG. 4, DTFT1 and DTFT2 may be p-type TFTs, and in actual operation, they may also be n-type TFTs.

During the operation of the touch display module in FIG. 4, at the first charging stage of each display time period, the first charging control module 312 may be configured to enable the first data voltage Vdata1 to charge the first storage capacitor Cs1 through the first driving transistor DTFT1 under the control of the second scanning signal from the first gate line G1. At the second charging stage of each display time period, the second charging control module 322 may be configured to enable the second electrode of the second driving transistor DTFT2 to receive the second data voltage Vdata2 on the $n^{th}$ data line Data n under the control of the third scanning signal from the second gate line G2, so as to turn on the second driving transistor DTFT2, thereby to enable the second data voltage Vdata2 to charge the second storage capacitor Cs2 through the second driving transistor DTFT2.

In the embodiments of the present disclosure, the transistors may be thin film transistors, field effect transistors or any other elements having a same characteristic. In order to differentiate two electrodes other than the gate electrode, a first electrode of the transistor may be a source electrode or a drain electrode, and a second electrode may be a drain electrode or a source electrode. In addition, depending on the characteristics, the transmission may be an n-type or a p-type transistor. For the driver circuit in the embodiments of the present disclosure, all the transistors are p-type transistors. Of course, p-type transistors may also be used, which all falls within the scope of the present disclosure.

In a possible embodiment of the present disclosure, the touch driving unit is further configured to, at the touch time period, output a light-emission turn-off control signal to the light-emission control line, so as to enable the anode of the first OLED to be in the floating state under the control of the first pixel driver circuit and thereby to enable the first OLED not to emit light, and enable the anode of the second OLED to be in the floating state under the control of the second pixel driver circuit and thereby to enable the second OLED not to emit light. At this time, a capacitance between the cathode and the anode of the first OLED and a capacitance between the cathode and the anode of the second OLED may be omitted. As a result, it is able to remarkably reduce the RC loading, thereby to increase the touch driving frequency.

In a possible embodiment of the present disclosure, the touch driving unit is further configured to, at the touch time period, output the touch scanning signal to the touch electrode, the data line, the resetting scanning line, the first gate line and the second gate line simultaneously, so as to drive the touch electrode, the data line, the resetting scanning line, the first gate line and the second gate line synchronously. In other words, the touch electrode, the control lines connected to the pixel driver circuit other than the light-emission control line, and the signal lines connected to the pixel driver circuit may be driven synchronously, so as to cancel out the influence of the ground capacitor on the touch electrode.

In a possible embodiment of the present disclosure, the first resetting module includes a first resetting transistor, a gate electrode of which is connected to the resetting scanning line, a first electrode of which is connected to the gate electrode of the first driving transistor, and a second electrode of which is connected to the resetting signal line. The second resetting module includes a second resetting transistor, a gate electrode of which is connected to the resetting scanning line, a first electrode of which is connected to the gate electrode of the second driving transistor, and a second electrode of which is connected to the resetting signal line.

In a possible embodiment of the present disclosure, the first charging control module includes: a first data inputting transistor, a gate electrode of which is connected to the first gate line, a first electrode of which is connected to the $n^{th}$ data line, and a second electrode of which is connected to the second electrode of the first driving transistor; and a first charging control transistor, a gate electrode of which is connected to the first gate line, a first electrode of which is connected to the gate electrode of the first driving transistor, and a second electrode of which is connected to the first electrode of the first driving transistor.

The second charging control module includes: a second data inputting transistor, a gate electrode of which is connected to the second gate line, a first electrode of which is connected to the $n^{th}$ data line, and a second electrode of which is connected to the second electrode of the second driving transistor; and a second charging control transistor, a gate electrode of which is connected to the second gate line, a first electrode of which is connected to the gate electrode of the second driving transistor, and a second electrode of which is connected to the first electrode of the second driving transistor.

In a possible embodiment of the present disclosure, the first light-emission control module includes: a first light-emission control transistor, a gate electrode of which is connected to the light-emission control line, a first electrode of which is connected to the first level line, and a second electrode of which is connected to the first electrode of the first driving transistor; and a second light-emission control transistor, a gate electrode of which is connected to the light-emission control line, a first electrode of which is connected to the second electrode of the first driving transistor, and a second electrode of which is connected to the anode of the first OLED.

The second light-emission control module includes: a third light-emission control transistor, a gate electrode of which is connected to the light-emission control line, a first electrode of which is connected to the first level line, and a second electrode of which is connected to the first electrode of the second driving transistor; and a fourth light-emission control transistor, a gate electrode of which is connected to the light-emission control line, a first electrode of which is connected to the second electrode of the second driving transistor, and a second electrode of which is connected to the anode of the second OLED.

The double-pixel compensation circuit of the touch display module will be described hereinafter in more details.

Figure 5:
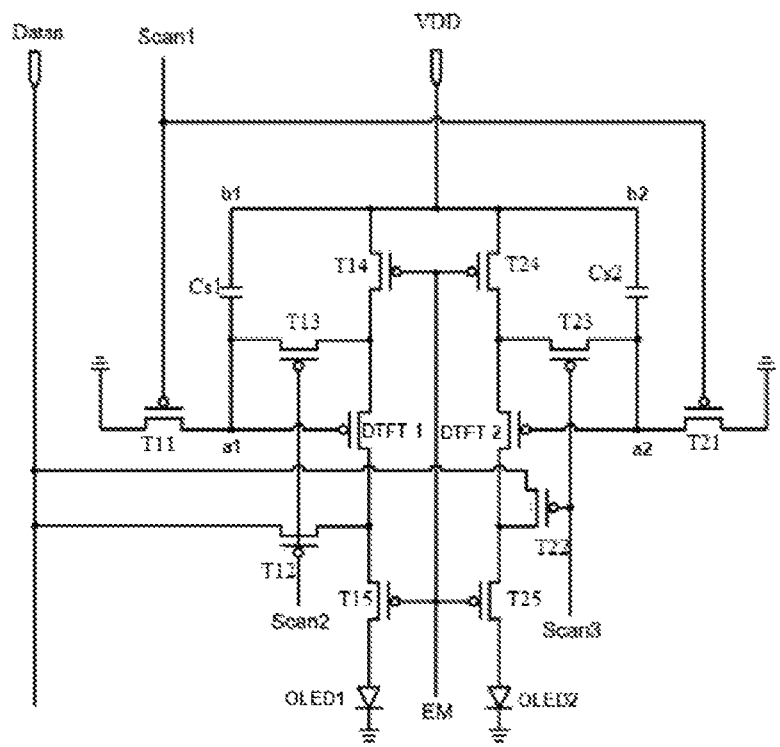
FIG. 5 is a circuit diagram of the double-pixel compensation circuit of the touch display module according to at least one embodiment of the present disclosure.

As shown in FIG. 5, the first pixel driver circuit includes the first driving transistor DTFT1, the first storage capacitor Cs1, the first resetting module, the first charging control module and the first light-emission control module. The second pixel driver circuit includes the second driving transistor DTFT2, the second storage capacitor Cs2, the second resetting module, the second charging control module and the second light-emission control module.

The first resetting module includes a first resetting transistor T11, a gate electrode of which is configured to receive a first scanning signal Scan1, a source electrode of which is connected to the gate electrode of the first driving transistor DTFT, and a drain electrode of which is grounded. The second resetting module includes a second resetting transistor T21, a gate electrode of which is configured to receive the first scanning signal Scan1, a first electrode of which is connected to the gate electrode of the second driving transistor DTFT2, and a second electrode of which is grounded.

The first charging control module includes: a first data inputting transistor T12, a gate electrode of which is configured to receive a second scanning signal Scan2, a source electrode of which is connected to the $n^{th}$ data line Data n, and a drain electrode of which is connected to a drain electrode of the first driving transistor DTFT1; and a first charging control transistor T13, a gate electrode of which is configured to receive the second scanning signal Scan2, a source electrode of which is connected to the gate electrode of the first driving transistor DTFT1, and a drain electrode of which is connected to a source electrode of the first driving transistor DTFT1.

The first light-emission control module includes: a first light-emission control transistor T14, a gate electrode of which is connected to the light-emission control line EM, a source electrode of which is configured to receive a high level VDD, and a drain electrode of which is connected to the source electrode of the first driving transistor DTFT1; and a second light-emission control transistor T15, a gate electrode of which is connected to the light-emission control line EM, a source electrode of which is connected to the drain electrode of the first driving transistor DTFT1, and a drain electrode of which is connected to the anode of the first OLED1.

The second charging control module includes: a second data inputting transistor T22, a gate electrode of which is configured to receive a third scanning signal Scan3, a source electrode of which is connected to the $n^{th}$ data line Data n, and a drain electrode of which is connected to a drain electrode of the second driving transistor DTFT2; and a second charging control transistor T23, a gate electrode of which is configured to receive the third scanning signal Scan3, a source electrode of which is connected to the gate electrode of the second driving transistor DTFT2, and a drain electrode of which is connected to a source electrode of the second driving transistor DTFT2.

The second light-emission control module includes: a third light-emission control transistor T24, a gate electrode of which is connected to the light-emission control line EM, a source electrode of which is configured to receive the high level VDD, and a drain electrode of which is connected to the source electrode of the second driving transistor DTFT2; and a fourth light-emission control transistor T25, a gate electrode of which is connected to the light-emission control line EM, a source electrode of which is connected to the drain electrode of the second driving transistor DTFT2, and a drain electrode of which is connected to the anode of the second OLED2.

A first end a1 of the first storage capacitor Cs1 is connected to the gate electrode of the DTFT1, and a second end b1 thereof is configured to receive VDD. A first end a2 of the second storage capacitor Cs2 is connected to the gate electrode of the DTFT2, and a second end b2 thereof is configured to receive VDD.

In FIG. 5, all the transistors are p-type TFTs.

Figure 6:
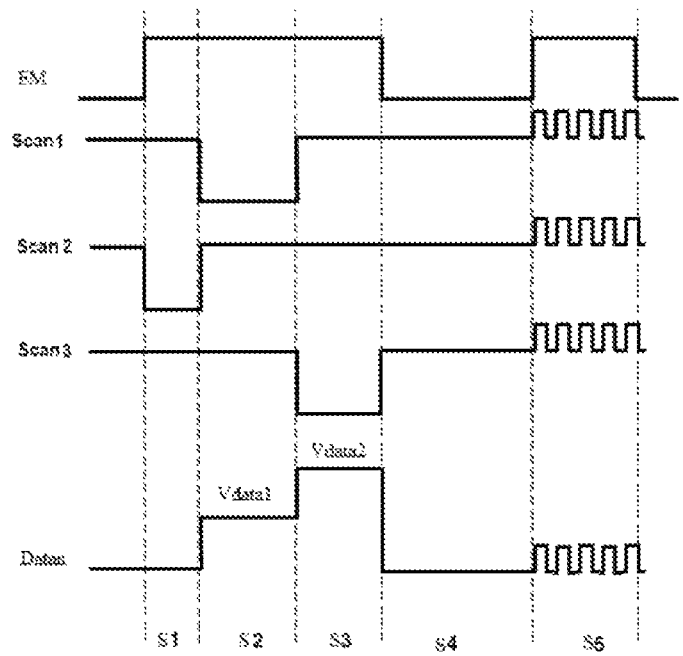
FIG. 6 is a time sequence diagram of the double-pixel compensation circuit in FIG. 5.

FIG. 6 shows a time sequence diagram of the driver circuit in FIG. 5. In FIG. 6, S1 represents the resetting stage of each display time period, S2 represents the first charging stage of each display time period, S3 represents the second charging stage of each display time period, S4 represents the light-emitting stage of each display time period, and S5 represents the touch time period.

Figure 7A:
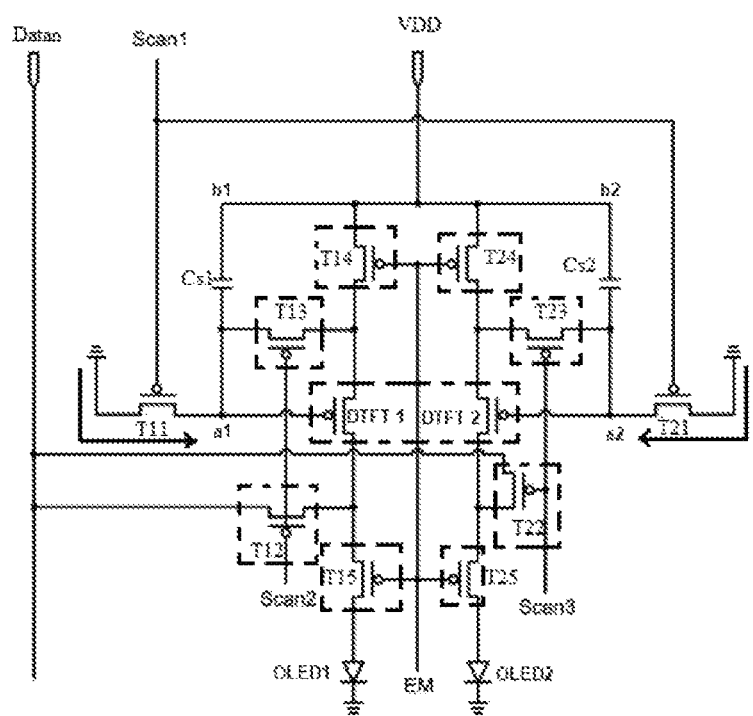
FIG. 7A is a circuit diagram of the double-pixel compensation circuit in FIG. 5 at a resetting stage of each display time period.

When the driver circuit in FIG. 5 is in an operating state (in FIGS. 7A, 7B, 7C and 7D, the TFT with a dotted box means that it is turned off at the corresponding stage), as shown in FIG. 7A, at the resetting stage S1 of each display time period, T11 and T21 are turned on, T12, T13, T14, T15, T22, T23, T24 and T25 are turned off. At this time, a1 and a2 are reset and grounded.

Figure 7B:
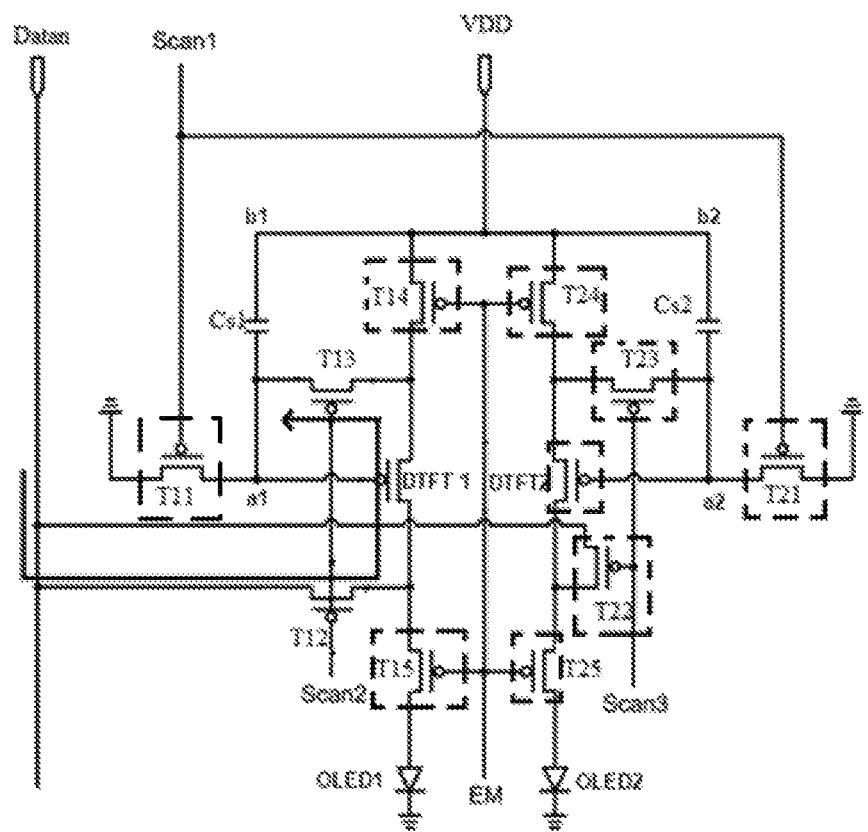
FIG. 7B is a circuit diagram of the double-pixel compensation circuit in FIG. 5 at a first charging stage of each display time period.

As shown in FIG. 7B, at the first charging stage S2 of each display time period, T12 and T13 are turned on, and T22, T23, T11, T14, T15, T21, T24 and T25 are turned off. Because a1 and a2 have been grounded, DTFT1 may be turned on, and a1 may be charged by the first data voltage Vdata1 on Data n through T12, DTFT1 and T13, until the potential at a1 is equal to Vdata1−Vth1 (i.e., a gate-to-source voltage of DTFT1 is equal to the threshold voltage Vth1 of DTFT1). At this time, because b1 always receives VDD, the potential at b1 may be maintained at Vdata1−Vth1 after the charging procedure. In addition, T15 is turned off, so no current may flow through OLED1, i.e., it is able to indirectly prolong a service life of OLED1.

Figure 7C:
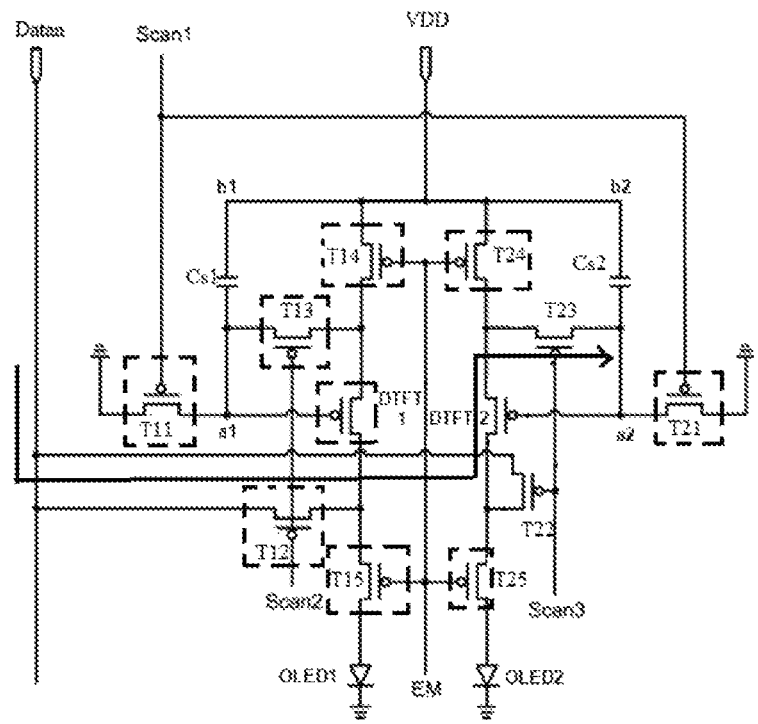
FIG. 7C is a circuit diagram of the double-pixel compensation circuit in FIG. 5 at a second charging stage of each display time period.

As shown in FIG. 7C, at the second charging stage S3 of each display time period, T22 and T23 are turned on, and T12, T13, T11, T14, T15, T21, T24 and T25 are turned off. Because a1 and a2 have been grounded, DTFT2 may be turned on, and a2 may be charged by the second data voltage Vdata2 on Data n through T22, DTFT2 and T23, until the potential at a2 is equal to Vdata2−Vth2 (i.e., a gate-to-source voltage of DTFT2 is equal to the threshold voltage Vth2 of DTFT2). At this time, because b2 always receives VDD, the potential at b2 may be maintained at Vdata2−Vth2 after the charging procedure. In addition, T25 is turned off, so no current may flow through OLED2, i.e., it is able to indirectly prolong a service life of OLED2.

Figure 7D:
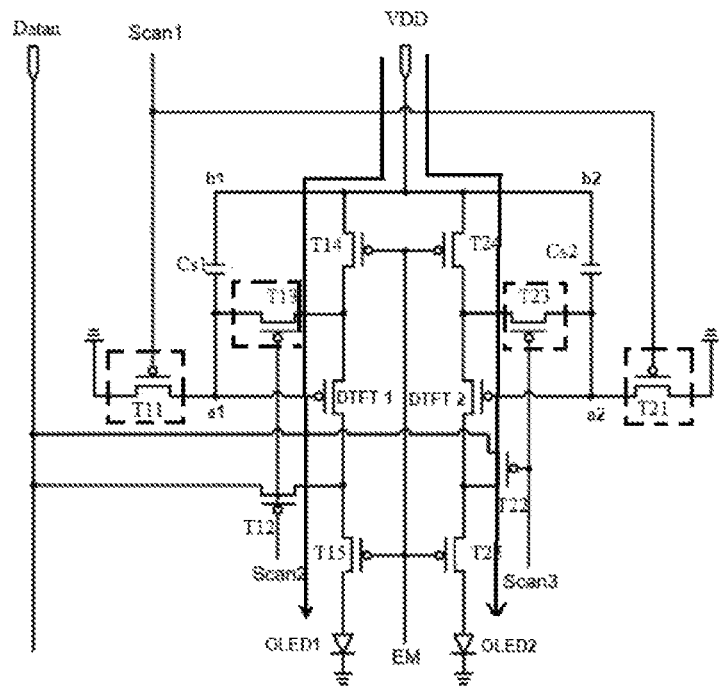
FIG. 7D is a circuit diagram of the double-pixel compensation circuit in FIG. 5 at a light-emitting stage of each display time period.

As shown in FIG. 7D, at the light-emitting stage S4 of each display time period where an AMOLED pixel starts to emit light, the source electrode of DTFT1 and the source electrode DTFT2 are configured to receive VDD. The current flows through T14, DTFT1 and T15, so as to enable OLED1 to emit light, and the current flows through T24, DTFT2 and T25, so as to enable OLED2 to emit light.

On the basis of an equation for calculating a TFT saturation current, the following equations may be acquired: $I_{OLED1}=K1*(V_{GS1}-Vth1)^2=K1*[VDD-(Vdata1-Vth1)-Vth1]^2=K1*(VDD-Vdata1)^2$, and $I_{OLED2}=K2*(V_{GS2}-Vth2)^2=K2*[VDD-(Vdata2-Vth2)-Vth2]^2=K2*(VDD-Vdata2)^2$, where K1 represents a current amplification coefficient of DTFT1, $V_{GS1}$ represents a gate-to-source voltage of DTFT1, $I_{OLED1}$ represents an operating current of OLED1, K2 represents a current amplification coefficient of DTFT2, $V_{GS2}$ represents a gate-to-source voltage of DTFT2, and $I_{OLED2}$ represents an operating current of OLED2.

It can be seen from the above equations that, $I_{OLED1}$ is relevant to VDD and Vdata1, rather than Vth1, and $I_{OLED2}$ is relevant to VDD and Vdata2, rather than Vth2. As a result, it is able to thoroughly prevent the occurrence of the threshold voltage drift for the driving transistor due to a manufacture process and long-term operation, and prevent a current flowing through the OLED from being adversely affected, thereby to ensure the normal operations of OLED1 and OLED2.

At the touch time period S5, apart from the cathodic electrode (the touch electrode), the signal lines other than the light-emission control line EM (including high level line for outputting the high level VDD, the data line for outputting the data voltage Vdata, the first scanning line Scan1 and the second scanning line Scan2) are driven synchronously, and an amplitude of the touch driving signal is smaller than a voltage amplitude on the signal lines at the display time period, so as to ensure all the TFTs to be kept in the initial states (i.e., in the states at the light-emitting stage of the display time period). At this time, no current flows through the anodes of OLED1 and OLED2, so OLED1 and OLED2 are each in the floating state. It is unnecessary to calculate a capacitance between the touch electrode and the anode, thereby to reduce the RC loading and effectively increase the driving frequency.

Figure 8:
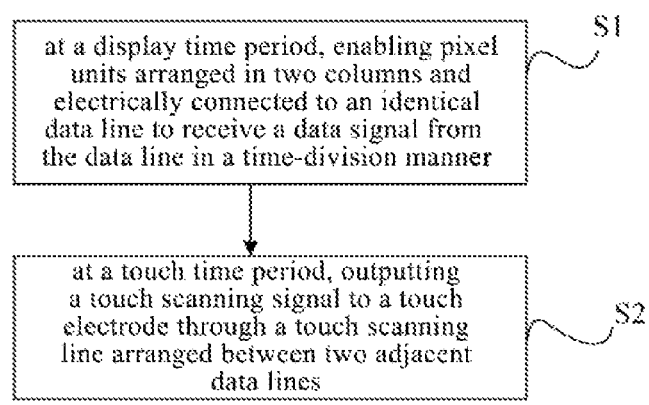
FIG. 8 is a flow chart of a method for driving the touch display module according to at least one embodiment of the present disclosure.

As shown in FIG. 8, the present disclosure provides in some embodiments a method for driving the above-mentioned touch display module, which includes: Step S1 of, at a display time period, enabling pixel units arranged in two columns and electrically connected to a same data line to receive a data signal from the data line in a time-division manner; and Step S2 of, at a touch time period, outputting a touch scanning signal to a touch electrode through a touch scanning line arranged between two adjacent data lines.

According to the method in the embodiments of the present disclosure, the pixel units arranged in two columns and electrically connected to the same data line may receive the data signal from the data line in a time-division manner at the display time period, and the touch scanning signal may be applied to the touch electrode via the touch scanning line between the two adjacent data lines at the touch time period. As a result, it is unnecessary to provide the touch scanning line at a pixel region while reducing the number of the data lines, thereby to improve an aperture ratio of the pixel region and prolong a service life of the display panel.

In a possible embodiment of the present disclosure, the touch display module further includes a touch driving unit, and the step of outputting the touch scanning signal to the touch electrode through the touch scanning line arranged between the two adjacent data lines includes outputting, by the touch driving unit, the touch scanning signal to the touch electrode through the touch scanning line.

In a possible embodiment of the present disclosure, the touch display module further includes a plurality of cathodic electrodes. The method further includes enabling the plurality of cathodic electrodes of the touch display module to be also used as the touch electrodes. The step of outputting, by the touch driving unit, the touch scanning signal to the touch electrode through the touch scanning line includes outputting, by the touch driving unit, the touch scanning signal to the cathodic electrode though the touch scanning line.

During the design of the in-cell self-capacitive AMOLED touch display module, the uppermost cathodic electrode may be divided and multiplexed, i.e., the cathodic electrode as an entire layer may be divided into a plurality of block-like cathodic electrodes corresponding to each pixel region, and each block-like cathodic electrode may serve as one touch electrode at the touch time period. The touch scanning signal may be applied to the plurality of block-like cathodic electrodes via the touch scanning line at the touch time period.

In a possible embodiment of the present disclosure, the pixel units in each column include a plurality of subpixel units each includes an OLED and a pixel driver circuit. The method further includes, at the touch time period, enabling, by the pixel driver circuit, an anode of the corresponding OLED to be in a floating state, so as to enable the OLED not to emit light.

In the embodiments of the present disclosure, at the touch time period, the anode of the corresponding OLED may be in the floating state under the control of the pixel driver circuit, so as to enable the OLED not to emit light. At this time, the capacitance between the cathode and the anode may be omitted, so it is able to remarkably reduce the RC loading, thereby to increase the touch driving frequency.

In a possible embodiment of the present disclosure, the step of enabling, by the pixel driver circuit, the anode of the corresponding OLED to be in the floating state includes outputting, by the touch driving unit, a light-emission turn-off control signal to the light-emission control line, so as to enable the anode of the corresponding OLED to be in the floating state under the control of the pixel driver circuit.

In a possible embodiment of the present disclosure, the touch display module includes a plurality of first pixel units, a plurality of second pixel units, a plurality of first gate lines and a plurality of second gate lines. Each first pixel unit includes a first OLED and a first pixel driver circuit, and each second pixel unit includes a second OLED and a second pixel driver circuit. The first pixel unit and the corresponding second pixel unit are arranged in a same row and in adjacent columns, and an $n^{th}$ data line is arranged between the first pixel unit and the second pixel unit, where n is a positive integer. Each first pixel driver circuit is connected to one of the first gate lines, and each second pixel driver circuit is connected to one of the second gate lines. Each first pixel driver circuit and the corresponding second pixel driver circuit are connected to the $n^{th}$ data line. The step of enabling, at the display time period, the pixel units arranged in two columns and electrically connected to the same data line to receive the data signal from the data line in a time-division manner includes enabling, at the display time period, the first pixel driver circuit and the second pixel driver circuit to receive a data signal from the $n^{th}$ data line in a time-division manner.

In a possible embodiment of the present disclosure, each first pixel driver circuit and the corresponding second pixel driver circuit are connected to a same light-emission control line. Each first pixel driver circuit includes a first driving transistor, a first storage capacitor, a first resetting module, a first charging control module and a first light-emission control module. Each second pixel driver circuit includes a second driving transistor, a second storage capacitor, a second resetting module, a second charging control module and a second light-emission control module. The display time period includes a resetting stage, a first charging stage, a second charging stage and a light-emitting stage. The step of enabling, at the display time period, the first pixel driver circuit and the second pixel driver circuit to receive the data signal from the $n^{th}$ data line in a time-division manner includes: at the resetting stage of each display time period, resetting, by the first resetting module, a potential at a gate electrode of the first driving transistor to a resetting voltage on the resetting signal line under the control of a first scanning signal from the resetting scanning line so as to turn off the first driving transistor, and resetting, by the second resetting module, a potential at a gate electrode of the second driving transistor to the resetting voltage on the resetting signal line under the control of the first scanning signal from the resetting scanning line so as to turn off the second driving transistor; at the first charging stage of each display time period, enabling, by the first charging control module, a first electrode of the first driving transistor to be electrically connected to the gate electrode of the first driving transistor and enabling a second electrode of the first driving transistor to receive a first data voltage Vdata1 on the $n^{th}$ data line under the control of a second scanning signal from the first gate line, so as to turn on the first driving transistor, thereby to enable the first data voltage Vdata1 to charge the first storage capacitor through the first driving transistor until the potential at the gate electrode of the first driving transistor is equal to Vdata1−Vth1, where Vth1 represents a threshold voltage of the first driving transistor; at the second charging stage of each display time period, enabling, by the second charging control module, a first electrode of the second driving transistor to be connected to the gate electrode of the second driving transistor and enabling a second electrode of the second driving transistor to receive a second data voltage Vdata2 on the $n^{th}$ data line under the control of a third scanning signal from the second gate line, so as to turn on the second driving transistor, thereby to enable the second data voltage Vdata2 to charge the second storage capacitor through the second driving transistor until the potential at the gate electrode of the second driving transistor is equal to Vdata2−Vth2, where Vth2 represents a threshold voltage of the second driving transistor; and at the light-emitting stage of each display time period, enabling, by the first light-emission control module, the first electrode of the first driving transistor to be connected to a first level line and enabling the second electrode of the first driving transistor to be connected to the anode of the first OLED under the control of the light-emission control line, so as to enable the first driving transistor to drive the first OLED to emit light, and enabling, by the second light-emission control module, the first electrode of the second driving transistor to be connected to the first level line and enabling the second electrode of the second driving transistor to be connected to the anode of the second OLED under the control of the light-emission control line, so as to enable the second driving transistor to drive the second OLED to emit light.

In a possible embodiment of the present disclosure, the method further includes, at the touch time period, outputting, by the touch driving unit, the touch scanning signal to the touch electrode, the data line, the resetting scanning line, the first gate line and the second gate line, so as to drive the touch electrode, the data line, the resetting scanning line, the first gate line and the second gate line synchronously. In other words, the touch electrode, the control lines connected to the pixel driver circuit other than the light-emission control line and the signal lines connected to the pixel driver circuit may be driven synchronously, so as to cancel out the influence of the ground capacitor on the touch electrode.

The present disclosure further provides in some embodiments a touch display panel including the above-mentioned touch display module.

The present disclosure further provides in some embodiments a touch display device including the above-mentioned touch display panel.

The above are merely the preferred embodiments of the present disclosure. Obviously, a person skilled in the art may make further modifications and improvements without departing from the spirit of the present disclosure, and these modifications and improvements shall also fall within the scope of the present disclosure.

What is claimed is:

1. A touch display module, comprising touch electrodes, a plurality of pixel units arranged in rows and columns, a plurality of gate lines, and a plurality of data lines crossing the plurality of gate lines, wherein
the touch display module further comprises a plurality of touch scanning lines;
the pixel units in two columns are arranged between every two adjacent data lines, and each data line is electrically connected to the pixel units arranged in two columns and adjacent to the data line;
each touch scanning line is arranged between two adjacent data lines and connected to the corresponding touch electrode;
two gate lines are arranged between every two adjacent rows of pixel units;
the pixel units in each row comprise a first pixel unit and a second pixel unit arranged adjacent to each other;
the two gate lines comprises a first gate line and a second gate line; and
the first pixel unit and the second pixel unit are electrically connected to a same data line, the first pixel unit is connected to the first gate line, and the second pixel unit is connected to the second gate line;
the touch display module further comprises a touch driving unit;
the touch driving unit is connected to the touch scanning line and configured to output a touch scanning signal to the corresponding touch electrode via the touch scanning line at a touch time period;
each pixel unit comprises an organic light-emitting diode (OLED) and a pixel driver circuit connected to each other;
the pixel driver circuit is connected to a light-emission control line;
a plurality of cathodic electrodes of a plurality of OLEDs are also used as the touch electrodes and arranged above a plurality of pixel units;
the touch driving unit is further connected to the light-emission control line and further configured to output a light-emission turn-off control signal to the light-emission control line at the touch time period, so as to enable an anode of the corresponding OLED to be in a floating state under the control of the pixel driver circuit; and
the touch driving unit is further configured to output, at the touch time period, the touch scanning signal to control lines connected to the pixel driver circuit other than the light-emission control line, and signal lines connected to the pixel driver circuit.

2. The touch display module according to claim 1, wherein the touch scanning line is arranged between two adjacent columns of pixel units, the two adjacent columns of pixel units are connected to different data lines.

3. The touch display module according to claim 2, wherein the touch scanning line extends in a same direction to the data line.

4. The touch display module according to claim 1, further comprising a plurality of cathodic electrodes multiplexed as the touch electrodes, wherein the touch driving unit is further configured to output the touch scanning signal to the corresponding cathodic electrode via the touch scanning line at the touch time period.

5. The touch display module according to claim 1, comprising a plurality of first pixel units, a plurality of second pixel units, a plurality of first gate lines and a plurality of second gate lines, wherein
each first pixel unit comprises a first OLED and a first pixel driver circuit, and each second pixel unit comprises a second OLED and a second pixel driver circuit;
each first pixel unit and the corresponding second pixel unit are arranged in a same row and in adjacent columns, and an $n^{th}$ data line is arranged between the first pixel unit and the second pixel unit, where n is a positive integer;
each first pixel driver circuit is connected to one of the first gate lines, and each second pixel driver circuit is connected to one of the second gate lines; and
each first pixel driver circuit and the corresponding second pixel driver circuit are connected to the $n^{th}$ data line, so as to receive a data signal from the $n^{th}$ data line in a time-division manner at a display time period.

6. The touch display module according to claim 5, wherein each first pixel driver circuit and the second pixel driver circuit are connected to a same light-emission control line;
each first pixel driver circuit comprises a first driving transistor, a first storage capacitor, a first resetting module, a first charging control module and a first light-emission control module;
each second pixel driver circuit comprises a second driving transistor, a second storage capacitor, a second resetting module, a second charging control module and a second light-emission control module;
a gate electrode of the first driving transistor is connected to the first resetting module, a first electrode thereof is connected to a first level line through the first light-emission control module and further connected to the gate electrode of the first driving transistor through the first charging control module, and a second electrode thereof is connected to an anode of the first OLED through the first light-emission control module and further connected to the $n^{th}$ data line through the first charging control module;
a first end of the first storage capacitor is connected to the gate electrode of the first driving transistor, and a second end thereof is connected to the first level line;
a gate electrode of the second driving transistor is connected to the second resetting module, a first electrode thereof is connected to the first level line through the second light-emission control module and further connected to the gate electrode of the second driving transistor through the second charging control module, and a second electrode thereof is connected to an anode of the second OLED through the second light-emission control module and further connected to the $n^{th}$ data line through the second charging control module; and
a first end of the second storage capacitor is connected to the gate electrode of the second driving transistor, and a second end of the second storage capacitor is connected the first level line.

7. The touch display module according to claim 6, wherein the first resetting module is connected to a resetting scanning line and a resetting signal line, and configured to, at a resetting stage of each display time period, reset a potential at the gate electrode of the first driving transistor to a resetting voltage on the resetting signal line under the control of a first scanning signal from the resetting scanning line, so as to turn off the first driving transistor;

the second resetting module is connected to the resetting scanning line and the resetting signal line, and configured to, at the resetting stage of each display time period, reset a potential at the gate electrode of the second driving transistor to the resetting voltage on the resetting signal line under the control of the first scanning signal from the resetting scanning line, so as to turn off the second driving transistor;

the first charging control module is connected to the first gate line and the $n^{th}$ data line, and configured to, at a first charging stage of each display time period, enable the first electrode of the first driving transistor to be connected to the gate electrode of the first driving transistor and enable the second electrode of the first driving transistor to receive a first data voltage Vdata1 on the $n^{th}$ data line under the control of a second scanning signal from the first gate line, so as to turn on the first driving transistor, thereby to enable the first data voltage Vdata1 to charge the first storage capacitor through the first driving transistor until the potential at the gate electrode of the first driving transistor is equal to Vdata1-Vth1, where Vth1 represents a threshold voltage of the first driving transistor;

the second charging control module is connected to the second gate line and the $n^{th}$ data line, and configured to, at a second charging stage of each display time period, enable the first electrode of the second driving transistor to be connected to the gate electrode of the second driving transistor and enable the second electrode of the second driving transistor to receive a second data voltage Vdata2 on the $n^{th}$ data line under the control of a third scanning signal from the second gate line, so as to turn on the second driving transistor, thereby to enable the second data voltage Vdata2 to charge the second storage capacitor through the second driving transistor until the potential at the gate electrode of the second driving transistor is equal to Vdata2-Vth2, where Vth2 represents a threshold voltage of the second driving transistor;

the first light-emission control module is connected to the light-emission control line and the first level line, and configured to, at a light-emitting stage of each display time period, enable the first electrode of the first driving transistor to be connected to the first level line and enable the second electrode of the first driving transistor to be connected to the anode of the first OLED under the control of the light-emission control line, so as to enable the first driving transistor to drive the first OLED to emit light; and the second light-emission control module is connected to the light-emission control line and the first level line, and configured to, at the light-emitting stage of each display time period, enable the first electrode of the second driving transistor to be connected to the first level line and enable the second electrode of the second driving transistor to be connected to the anode of the second OLED under the control of the light-emission control line, so as to enable the second driving transistor to drive the second OLED to emit light.

8. The touch display module according to claim 7, wherein the touch driving unit is further configured to, at the touch time period, output a light-emission turn-off control signal to the light-emission control line, so as to enable the anode of the first OLED to be in the floating state under the control of the first pixel driver circuit and thereby to enable the first OLED not to emit light, and enable the anode of the second OLED to be in the floating state under the control of the second pixel driver circuit and thereby to enable the second OLED not to emit light.

9. The touch display module according to claim 8, wherein the touch driving unit is further configured to, at the touch time period, output the touch scanning signal to the touch electrode, the data line, the resetting scanning line, the first gate line and the second gate line simultaneously, so as to drive the touch electrode, the data line, the resetting scanning line, the first gate line and the second gate line synchronously.

10. A method for driving the touch display module according to claim 1, further comprising steps of:
at a display time period, enabling pixel units arranged in two columns and electrically connected to a same data line to receive a data signal from the data line in a time-division manner; and
at a touch time period, outputting a touch scanning signal to a touch electrode through a touch scanning line arranged between two adjacent data lines.

11. The method according to claim 10, wherein the touch display module further comprises a plurality of cathodic electrodes;
the method further comprises enabling the plurality of cathodic electrodes of the touch display module to be multiplexed as the touch electrodes; and
the step of outputting, by the touch driving unit, the touch scanning signal to the touch electrode through the touch scanning line comprises outputting, by the touch driving unit, the touch scanning signal to the cathodic electrode through the touch scanning line.

12. The method according to claim 10, wherein the pixel units in each column include a plurality of subpixel units each includes an Organic Light-Emitting Diode (OLED) and a pixel driver circuit, and the method further comprises, at the touch time period, enabling, by the pixel driver circuit, an anode of the corresponding OLED to be in a floating state, so as to enable the OLED not to emit light.

13. The method according to claim 10, wherein the touch display module comprises a plurality of first pixel units, a plurality of second pixel units, a plurality of first gate lines and a plurality of second gate lines;
each first pixel unit comprises a first OLED and a first pixel driver circuit, and each second pixel unit includes a second OLED and a second pixel driver circuit;
each first pixel unit and the corresponding second pixel unit are arranged in a same row and in adjacent columns, and an $n^{th}$ data line is arranged between the first pixel unit and the second pixel unit, where n is a positive integer;
each first pixel driver circuit is connected to one of the first gate lines, and each second pixel driver circuit is connected to one of the second gate lines;
each first pixel driver circuit and the corresponding second pixel driver circuit are connected to the $n^{th}$ data line; and
the step of enabling, at the display time period, the pixel units arranged in two columns and electrically connected to the same data line to receive the data signal from the data line in a time-division manner comprises enabling, at the display time period, the first pixel driver circuit and the second pixel driver circuit to receive a data signal from the $n^{th}$ data line in a time-division manner.

14. The method according to claim 13, wherein each first pixel driver circuit and the second pixel driver circuit are connected to a same light-emission control line, each first pixel driver circuit comprises a first driving transistor, a first storage capacitor, a first resetting module, a first charging control module and a first light-emission control module, each second pixel driver circuit comprises a second driving transistor, a second storage capacitor, a second resetting module, a second charging control module and a second light-emission control module, the display time period comprises a resetting stage, a first charging stage, a second charging stage and a light-emitting stage, and the step of enabling, at the display time period, the first pixel driver circuit and the second pixel driver circuit to receive the data signal from the $n^{th}$ data line in a time-division manner comprises:

at the resetting stage of each display time period, resetting, by the first resetting module, a potential at a gate electrode of the first driving transistor to a resetting voltage on the resetting signal line under the control of a first scanning signal from the resetting scanning line so as to turn off the first driving transistor, and resetting, by the second resetting module, a potential at a gate electrode of the second driving transistor to the resetting voltage on the resetting signal line under the control of the first scanning signal from the resetting scanning line so as to turn off the second driving transistor;

at the first charging stage of each display time period, enabling, by the first charging control module, a first electrode of the first driving transistor to be connected to the gate electrode of the first driving transistor and enabling a second electrode of the first driving transistor to receive a first data voltage Vdata1 on the $n^{th}$ data line under the control of a second scanning signal from the first gate line, so as to turn on the first driving transistor, thereby to enable the first data voltage Vdata1 to charge the first storage capacitor through the first driving transistor until the potential at the gate electrode of the first driving transistor is equal to Vdata1−Vth1, where Vth1 represents a threshold voltage of the first driving transistor;

at the second charging stage of each display time period, enabling, by the second charging control module, a first electrode of the second driving transistor to be connected to the gate electrode of the second driving transistor and enabling a second electrode of the second driving transistor to receive a second data voltage Vdata2 on the $n^{th}$ data line under the control of a third scanning signal from the second gate line, so as to turn on the second driving transistor, thereby to enable the second data voltage Vdata2 to charge the second storage capacitor through the second driving transistor until the potential at the gate electrode of the second driving transistor is equal to Vdata2−Vth2, where Vth2 represents a threshold voltage of the second driving transistor; and at the light-emitting stage of each display time period, enabling, by the first light-emission control module, the first electrode of the first driving transistor to be connected to a first level line and enabling the second electrode of the first driving transistor to be connected to the anode of the first OLED under the control of the light-emission control line, so as to enable the first driving transistor to drive the first OLED to emit light, and enabling, by the second light-emission control module, the first electrode of the second driving transistor to be connected to the first level line and enabling the second electrode of the second driving transistor to be connected to the anode of the second OLED under the control of the light-emission control line, so as to enable the second driving transistor to drive the second OLED to emit light.

15. The method according to claim 14, further comprising, at the touch time period, outputting, by the touch driving unit, the touch scanning signal to the touch electrode, the data line, the resetting scanning line, the first gate line and the second gate line, so as to drive the touch electrode, the data line, the resetting scanning line, the first gate line and the second gate line synchronously.

16. A touch display panel, comprising the touch display module according to claim 1.

\* \* \* \* \*